United States Patent
Moriya et al.

(10) Patent No.: US 10,475,837 B2
(45) Date of Patent: Nov. 12, 2019

(54) IMAGE SENSOR AND ELECTRONIC DEVICE

(71) Applicant: SONY CORPORATION, Tokyo (JP)

(72) Inventors: Yusuke Moriya, Tokyo (JP); Kunihiko Hikichi, Kanagawa (JP); Hiroyuki Itou, Kanagawa (JP); Atsushi Yamamoto, Kanagawa (JP); Masahiko Shimizu, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/579,261

(22) PCT Filed: Jun. 9, 2016

(86) PCT No.: PCT/JP2016/067192
§ 371 (c)(1),
(2) Date: Dec. 4, 2017

(87) PCT Pub. No.: WO2016/208403
PCT Pub. Date: Dec. 29, 2016

(65) Prior Publication Data
US 2018/0158858 A1  Jun. 7, 2018

(30) Foreign Application Priority Data
Mar. 22, 2016 (JP) .................................. 2016-056937

(51) Int. Cl.
*H01L 27/146* (2006.01)
*H04N 5/369* (2011.01)
(Continued)

(52) U.S. Cl.
CPC .......... *H01L 27/14627* (2013.01); *G02B 3/00* (2013.01); *G02B 5/00* (2013.01);
(Continued)

(58) Field of Classification Search
CPC ......... H01L 27/14627; H01L 27/14629; H01L 27/14625; H04N 5/2254; H04N 5/2252; H04N 5/369
See application file for complete search history.

(56) References Cited

U.S. PATENT DOCUMENTS

2005/0045928 A1* 3/2005 Kuriyama ........... H01L 27/1463
257/294
2007/0090275 A1* 4/2007 Toyoda ............. H01L 27/14621
250/208.1
(Continued)

FOREIGN PATENT DOCUMENTS

JP 2002-072446 A 3/2002
JP 2005-072662 A 3/2005
(Continued)

OTHER PUBLICATIONS

International Search Report and Written Opinion of PCT Application No. PCT/JP2016/067192, dated Aug. 9, 2016, 09 pages of ISRWO.

*Primary Examiner* — Abdelaaziz Tissire
(74) *Attorney, Agent, or Firm* — Chip Law Group

(57) ABSTRACT

An electronic device has a mounted image sensor including a light shielding body having light shielding walls and light transmitting portions each formed in an opening between the light shielding walls, a first light-shielding layer formed on a light incident surface side of the light shielding body and having an opening narrower than the opening of the light shielding body for each of the openings of the light shielding body, a microlens provided for each of the openings of the first light-shielding layer on the light incident surface side of the light shielding body, and a light receiving element layer with an array of a large number of light receiving elements.
(Continued)

The present disclosure can be used for, for example, a compound-eye optical system.

14 Claims, 15 Drawing Sheets

(51) Int. Cl.
    *H04N 5/225*     (2006.01)
    *H01L 31/0232*     (2014.01)
    *G02B 3/00*     (2006.01)
    *G02B 5/00*     (2006.01)

(52) U.S. Cl.
    CPC .. *H01L 27/14623* (2013.01); *H01L 27/14625* (2013.01); *H01L 27/14629* (2013.01); *H01L 31/02327* (2013.01); *H04N 5/2254* (2013.01); *H04N 5/369* (2013.01)

(56) References Cited

U.S. PATENT DOCUMENTS

| | | | |
|---|---|---|---|
| 2007/0284511 A1* | 12/2007 | Toyoda | G02B 3/0075 250/208.1 |
| 2009/0014823 A1 | 1/2009 | Kokusenya | |
| 2009/0179142 A1* | 7/2009 | Duparre | G02B 3/0031 250/208.1 |
| 2009/0273046 A1* | 11/2009 | Inaba | G02B 5/201 257/432 |
| 2010/0052192 A1* | 3/2010 | Hasegawa | H01L 23/552 257/797 |
| 2010/0207225 A1* | 8/2010 | Masuda | H01L 27/1463 257/432 |
| 2011/0032409 A1* | 2/2011 | Rossi | G02B 5/005 348/340 |
| 2011/0080487 A1* | 4/2011 | Venkataraman | H04N 5/2253 348/218.1 |
| 2012/0081801 A1* | 4/2012 | Duparre | B29D 11/00375 359/811 |
| 2013/0019461 A1* | 1/2013 | Rudmann | H01L 25/167 29/592.1 |
| 2013/0134536 A1* | 5/2013 | Mori | H01L 27/1462 257/432 |
| 2014/0347747 A1* | 11/2014 | Rudmann | B29D 11/00307 359/722 |
| 2015/0008554 A1 | 1/2015 | Akiyama | |
| 2016/0216493 A1* | 7/2016 | Wan | G02B 13/0085 |
| 2016/0252734 A1* | 9/2016 | Rossi | G02B 17/08 348/340 |
| 2017/0338265 A1* | 11/2017 | Yoshiba | H01L 27/14621 |
| 2018/0188422 A1* | 7/2018 | Fujii | G02B 3/0068 |

FOREIGN PATENT DOCUMENTS

| | | | |
|---|---|---|---|
| JP | 2005072662 A | * | 3/2005 |
| JP | 2009-015981 A | | 1/2009 |
| JP | 2009-021415 A | | 1/2009 |
| JP | 2013-157442 A | | 8/2013 |
| JP | 2015-015296 A | | 1/2015 |

* cited by examiner

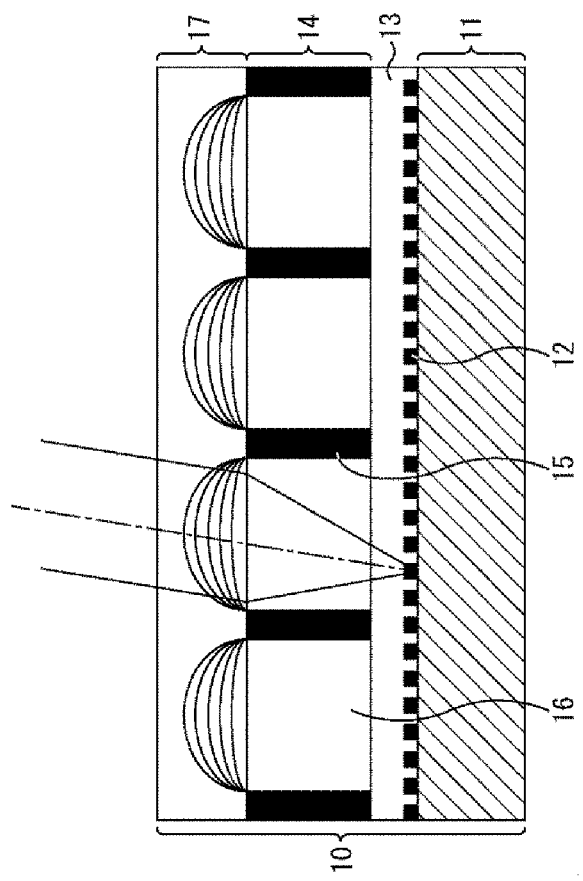

IMAGE SENSOR AND ELECTRONIC DEVICE

CROSS REFERENCE TO RELATED APPLICATIONS

This application is a U.S. National Phase of International Patent Application No. PCT/JP2016/067192 filed on Jun. 9, 2016, which claims priority benefit of Japanese Patent Application No. JP 2015-125358 filed in the Japan Patent Office on Jun. 23, 2015 and also claims priority benefit of Japanese Patent Application No. JP 2016-056937 filed in the Japan Patent Office on Mar. 22, 2016. Each of the above-referenced applications is hereby incorporated herein by reference in its entirety.

TECHNICAL FIELD

The present disclosure relates to an image sensor and an electronic device and in particular, relates to an image sensor preferably used for, for example, a compound-eye optical system and to an electronic device.

BACKGROUND ART

Conventionally, for example, as an image sensor used for a compound-eye optical system, a configuration is known in which a light shielding body is provided between a microlens and a light receiving element (refer to, e.g., Patent Literature 1).

FIG. 1 illustrates a configuration example of a conventional image sensor in which a light shielding body is provided between a microlens and a light receiving element.

The image sensor 10 is configured by laminating a light receiving element layer 11, a transparent insulating layer 13, a light shielding body 14, and a microlens array 17. The light receiving element layer 11 includes a large number of light receiving elements 12 that are arranged horizontally and vertically. The light shielding body 14 includes a light transmitting portion 16 obtained by forming a photopolymerizable resin that transmits light into a columnar shape by lithography, and a light shielding wall 15 that is formed by filling a black pigment resin between the light transmitting portions 16. The microlens array 17 is formed by arranging one microlens to each opening (light transmitting portion 16 surrounded by the light shielding walls 15) of the light shielding body 14 and laminating cover glass and the like onto the microlens for flattening.

With the image sensor 10, incident light collected by the microlens array 17 can be made incident on the light receiving element 12 just below the light transmitting portion 16 via the light transmitting portion 16 surrounded by the light shielding walls 15. Further, the light shielding body 14 is arranged, thereby enabling suppression of the leakage of the collected incident light to a light receiving element at an adjacent block. Furthermore, the light transmitting portion 16 is arranged between the light shielding walls 15 forming the light shielding body 14. Therefore, it is possible to prevent generation of dew condensation on a side surface of the light shielding wall 15 due to surrounding environmental change such as temperature change.

CITATION LIST

Patent Literature

Patent Literature 1: JP 2005-72662A

DISCLOSURE OF INVENTION

Technical Problem

As mentioned above, with the image sensor 10, the light shielding body 14 is arranged, thereby suppressing the leakage of incident light. However, the image sensor 10 is still susceptible to mixing color or stray light.

Further, positions of the light shielding wall 15 and the light transmitting portion 16 forming the light shielding body 14 in the image sensor 10 are determined by formation of a photopolymerizable resin into a columnar shape by lithography. However, since the thickness of the photopolymerizable resin forming the light transmitting portion 16 is relatively large, the forming precision of the light transmitting portion 16 is difficult to be increased, and it is difficult to form the light transmitting portion 16 into an ideally rectangular shape.

This may cause a trouble in the case of connecting images obtained from the light receiving element 12 just below each microlens. The trouble will be described with reference to FIGS. 2A and 2B.

FIG. 2A is a bird-eye view when the light shielding body 14 of the image sensor 10 is viewed from a light incident side. As illustrated in the diagram, the light transmitting portion 16 is low in rectangularity. Further, as illustrated in FIG. 2B, an image formed on a light receiving element by incident light having transmitted the light transmitting portion 16 with a low rectangularity is also low in rectangularity. Therefore, the contour resolution becomes low and image composition near the contour becomes difficult.

The present disclosure is made in consideration of the situation and makes it possible to suppress the trouble such as mixing color, stray light, and reduction of the contour resolution that can be caused in the image sensor having a structure in which the light shielding body is arranged on the light receiving element layer.

Solution to Problem

An image sensor according to a first aspect of the present disclosure includes: a light shielding body having light shielding walls and light transmitting portions each formed in an opening between the light shielding walls; a first light-shielding layer formed on a light incident surface side of the light shielding body and having an opening narrower than the opening of the light shielding body for each of the openings of the light shielding body; a microlens provided for each of the openings of the first light-shielding layer on the light incident surface side of the light shielding body; and a light receiving element layer with an array of a large number of light receiving elements each performing photoelectrical conversion in accordance with incident light that is collected by the microlens and is input via the light transmitting portion of the light shielding body.

The image sensor according to the first aspect of the present disclosure can further include: a second light-shielding layer that is formed on a side of the light receiving element layer of the light shielding body and has an opening narrower than the opening of the light shielding body for each of the openings of the light shielding body.

The light shielding wall of the light shielding body can be formed by Si.

The first light-shielding layer can be formed by a light shielding member different from that of the light shielding wall.

The opening of the first light-shielding layer can be circular.

A wall surface shape of the opening of the first light-shielding layer can be reverse-tapered or vertical.

The second light-shielding layer can be formed by a light shielding member different from that of the light shielding wall.

An opening of the second light-shielding layer can be rectangular.

A light transmitting portion of the light shielding body can be formed by filling a light shielding member into an opening between the light shielding walls.

The image sensor according to the first aspect of the present disclosure can further include: a joint layer that joins the light shielding body and the light receiving element layer; and a light shielding portion that shields a side of the joint layer.

The light shielding portion can be formed by extension of the light shielding wall of the light shielding body.

The light shielding portion can be formed by extension of the light shielding wall of the light shielding body to the joint layer.

The light shielding portion can be formed by extension of the light shielding wall of the light shielding body to the light receiving element layer.

An electronic device according to a second aspect of the present disclosure has an image sensor mounted thereon, the image sensor including a light shielding body having light shielding walls and light transmitting portions each formed in an opening between the light shielding walls, a first light-shielding layer formed on a light incident surface side of the light shielding body and having an opening narrower than the opening of the light shielding body for each of the openings of the light shielding body, a microlens provided for each of the openings of the first light-shielding layer on the light incident surface side of the light shielding body, and a light receiving element layer with an array of a large number of light receiving elements each performing photoelectrical conversion in accordance with incident light that is collected by the microlens and is input via the light transmitting portion of the light shielding body.

An image sensor according to a third aspect of the present disclosure includes: a light shielding body having light shielding walls each using Si as a light shielding member and light transmitting portions each formed by filling a transparent member into an opening between the light shielding walls; and a light receiving element layer with an array of a large number of light receiving elements each performing photoelectrical conversion in accordance with incident light input via the light shielding body.

In the first to third aspects of the present disclosure, the incident light input via the light shielding body is made incident on the light receiving element layer.

Advantageous Effects of Invention

According to the first to third aspects of the present disclosure, it is possible to suppress the trouble such as mixing color, stray light, and reduction of contour resolution that can be caused in the image sensor having a structure in which the light shielding body is arranged on the light receiving element layer.

BRIEF DESCRIPTION OF DRAWINGS

FIG. 1 is a cross-sectional view illustrating a configuration example of a conventional image sensor.

MODE(S) FOR CARRYING OUT THE INVENTION

Hereinbelow, a specific description will be given of the preferred mode (hereinbelow, referred to as embodiments) for carrying out the present disclosure with reference to the drawings.

Figure 3:
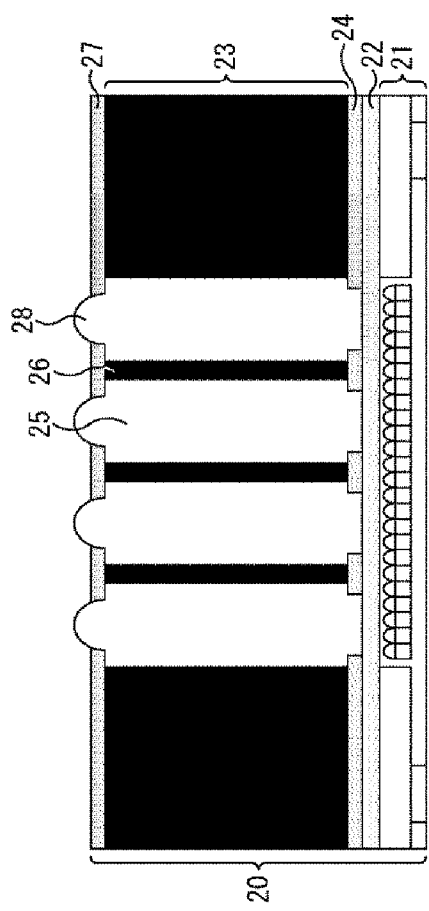
FIG. 3 is a cross-sectional view illustrating a configuration example of an image sensor to which the present disclosure is applied.

First Configuration Example of Image Sensor of Embodiment of the Present Disclosure FIG. 3 illustrates a configuration example of an image sensor according to an embodiment of the present disclosure.

An image sensor 20 is formed by joining a light receiving element layer 21 that is additionally generated and a light shielding body 23 by a thin-film joint resin layer 22. The light receiving element layer 21 and the light shielding body 23 are joined by the thin-film joint resin layer 22 without a gap, thereby enabling prevention of dew condensation that can conventionally happen at the gap. Thus, the deterioration of an obtained image can be suppressed.

The light receiving element layer 21 includes a large number of light receiving elements that are arranged horizontally and vertically. The thin-film joint resin layer 22 contains a transparent member, and is arranged to join the light receiving element layer 21 and the light shielding body 23 without a gap.

The light shielding body 23 includes a light shielding wall 26 containing a light shielding member, such as Si, and a light transmitting portion 25 containing a transparent member, such as glass or resin. The light shielding wall 26 is formed by opening a through-hole with processing such as lithography and dry etching to the light shielding member. The light transmitting portion 25 is formed by filling a transparent member between the light shielding walls 26 (i.e., a through-hole).

That is, the light shielding body 23 is formed so that an opening surrounded by the light shielding walls 26 is the light transmitting portion 25 and light incident from a top-side side (light incident surface side) is transmitted via a bottom-side side (light receiving element side).

On the bottom-side side of the light shielding body 23, a bottom-side light shielding layer 24 is formed, having a black color filter (BLK CF) or a light shielding member, such as Ti, W, with a rectangular opening narrower than each opening (light transmitting portion 25 surrounded by the light shielding walls 26) of the light shielding body 23.

On the other hand, on the top-side side of the light shielding body 23, a top-side light shielding layer 27 is formed, having the BLK CF or the light shielding member, such as Ti, W, with a circular opening narrower than each opening (light transmitting portion 25 surrounded by the light shielding walls 26) of the light shielding body 23. A microlens 28 is formed at a circular opening of the top-side light shielding layer 27.

Figure 4A:
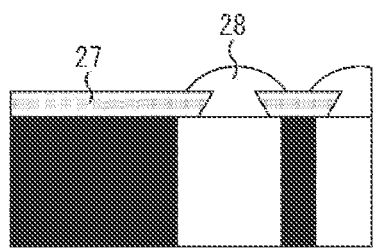
FIGS. 4A and 4B are diagrams illustrating a wall surface shape of an opening provided in a top-side light shielding layer.
Figure 4B:
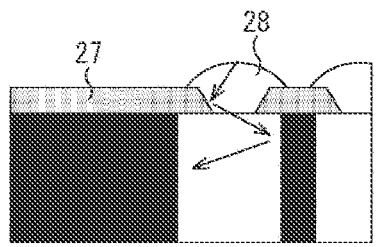

FIGS. 4A and 4B illustrate an example of a wall surface shape of the opening provided in the top-side light shielding layer 27.

FIG. 4A illustrates the case (the shape is referred to as a reverse-tapered shape in the present description) of processing the wall surface of the opening of the top-side light shielding layer 27 in the down direction (direction of the light receiving element). In the case of the reverse-tapered shape, the generation of reflection of incident light on the wall surface of the opening of the top-side light shielding layer 27 is suppressed.

FIG. 4B illustrates the case (the shape is referred to as a tapered shape in the present description) of processing the wall surface of the opening of the top-side light shielding layer 27 in the up direction (direction of the microlens). In the case of the tapered shape, on the wall surface of the top-side light shielding layer 27, the reflection of the incident light may be generated to generate stray light. Therefore, the wall surface shape of the opening of the top-side light shielding layer 27 is preferably not tapered as illustrated in FIG. 4B but is reverse-tapered as illustrated in FIG. 4A or vertical (not illustrated).

Next, a description will be given of a step of forming the top-side light shielding layer 27 and the microlens 28.

Figures 5A, 5B:
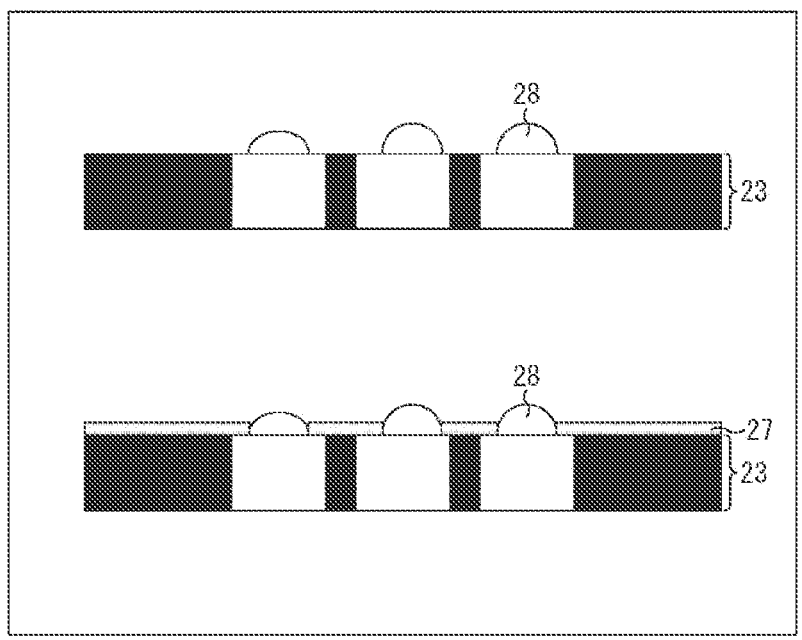
FIGS. 5A and 5B are diagrams illustrating steps in the case of forming a microlens and a top-side light shielding layer.
Figure 6A:
FIGS. 6A, 6B, and 6C are diagrams illustrating a forming step of the microlens.
Figure 6B:
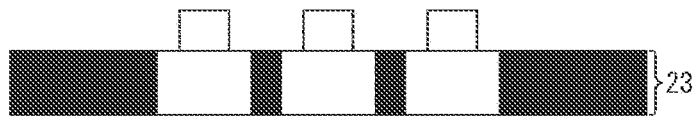
Figure 6C:
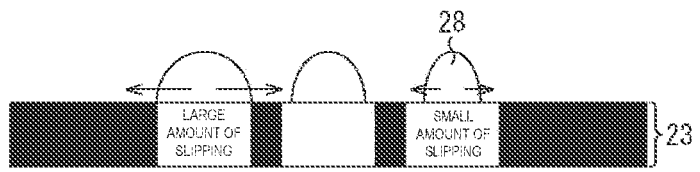

FIGS. 5A and 5B illustrate a step of the case of first forming the microlens 28 and next forming the top-side light shielding layer 27. FIGS. 6A, 6B, and 6C illustrate details of the step of forming the microlens 28 in this case.

In the case of forming the microlens 28 before forming the top-side light shielding layer 27, as illustrated in FIG. 6B, on the light transmitting portion 25 of the light shielding body 23, a lens member is arranged with photolithography (PR). As illustrated in FIG. 6C, with resist reflow (heating), the lens member is processed to a shape of the microlens 28.

In this case, since there is no top-side light shielding layer 27 that stops the slipping around the lens member, the variation in amount of slipping is caused and the variation in shape and size of each microlens 28 may be generated. Consequently, a trouble, such as bending in an obtained image, may be generated. In order to prevent the trouble, the microlens 28 is preferably formed after formation of the top-side light shielding layer 27.

Figure 7A:
FIGS. 7A and 7B are diagrams illustrating steps in the case of forming a top-side light shielding layer and a microlens.
Figure 7B:
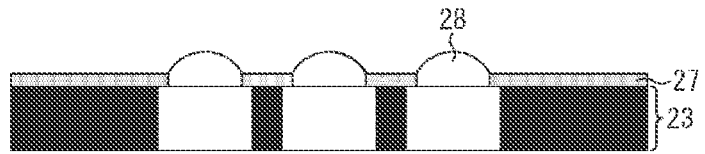
Figure 8A:
FIGS. 8A, 8B, 8C, and 8D are diagrams illustrating steps in the case of forming a top-side light shielding layer and a microlens.
Figure 8B:
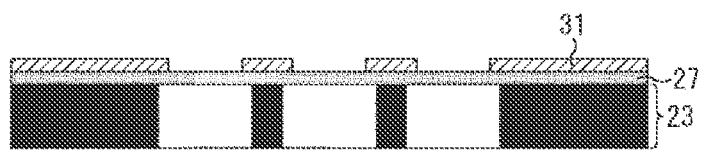
Figure 8C:
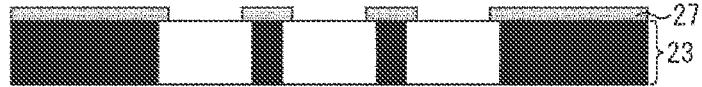
Figure 8D:
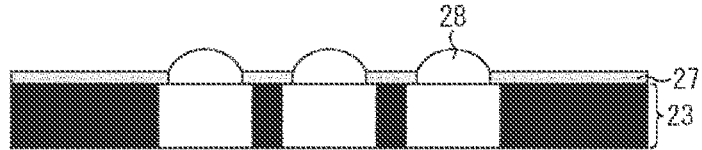
Figure 9A:
FIGS. 9A, 9B, and 9C are diagrams illustrating a forming step of a microlens.
Figure 9B:
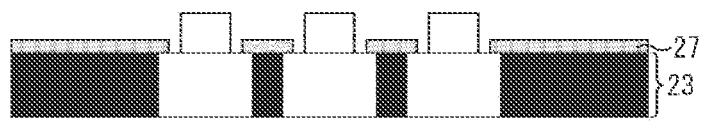
Figure 9C:
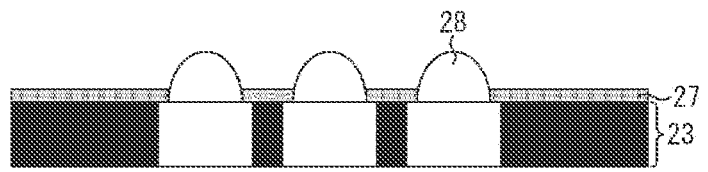

Next, FIGS. 7A, 7B, 8A, 8B, 8C, and 8D illustrate a step of the case of first forming the top-side light shielding layer 27 and next forming the microlens 28. FIGS. 9A, 9B, and 9C illustrate details of the step of forming the microlens 28 in this case.

In the case of forming the top-side light shielding layer 27 with the BLK CF, as illustrated in f FIG. 7A, with the PR, the BLK CF is coated, thereby enabling formation of the top-side light shielding layer 27. In the case where the top-side light shielding layer 27 is formed by Ti or W, as illustrated in FIG. 8A, Ti or the like is coated on the entire surface. Thereafter, as illustrated in FIG. 8B, resist that covers a part desired to remain as the top-side light shielding layer 27 is coated with the PR. As illustrated in FIG. 8C, excess Ti is removed with dry etching or the like, thereby forming the top-side light shielding layer 27.

After formation of the top-side light shielding layer 27, as illustrated in FIG. 8B, the lens member is arranged to the opening of the top-side light shielding layer 27 with the PR. As illustrated in FIG. 8C, the lens member is processed to the shape of the microlens 28 with the resist reflow (heating).

In this case, the top-side light shielding layer 27 to stop the slipping around the lens member is already formed. Therefore, it is possible to improve the uniformity of the shape and size of each microlens 28.

Figure 10A:
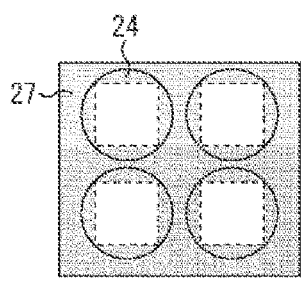
FIGS. 10A and 10B are diagrams for explaining an advantageous effect obtained by providing a top-side light shielding layer and a bottom-side light shielding layer.

FIG. 10A is a bird-eye view when seeing the light shielding body 23 of the above-formed image sensor 20 from the light incident side.

Figure 2A:
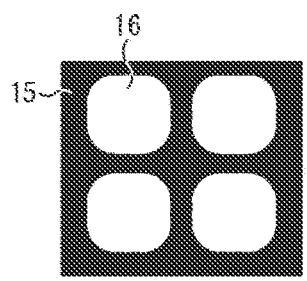
FIGS. 2A and 2B are diagrams for explaining problems of the image sensor in FIG. 1.
Figure 2B:
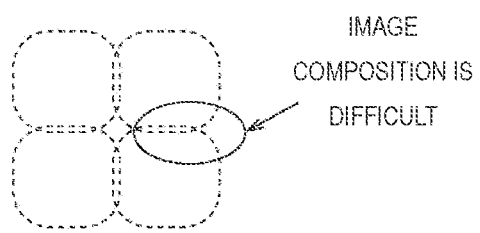
Figure 10B:
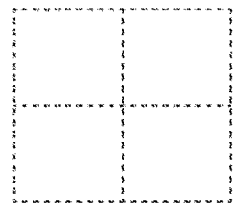

In the image sensor 20, light collected by the microlens 28 where the periphery thereof is shielded by the top-side light shielding layer 27 is transmitted through the opening (light transmitting portion 25) of the light shielding body 23 and is incident on the light receiving element layer 21. The incident light this time is transmitted through an opening of the bottom-side light shielding layer 24 that is narrower than the opening of light shielding body 23 and is formed into a rectangular shape. Therefore, it is possible to suppress the leakage of the incident light to an adjacent block. Further, as illustrated in FIG. 10B, regarding an image formed on the light receiving element, the reduction in contour resolution is suppressed. Therefore, also in the case of combining images obtained from the adjacent block of the light receiving element layer 21, as compared with the case illustrated in FIG. 2B, image composition near the contour can be easily executed.

First Modification of Image Sensor 20 of Embodiment of the Present Disclosure

As mentioned above, the light transmitting portion 25 of the light shielding body 23 contains a transparent member, such as glass or resin. In the case where the transparent member is glass, α rays are emitted from the glass due to the additive agent, and harmful influence is given to the light receiving element of the light receiving element layer 21.

Figure 11:
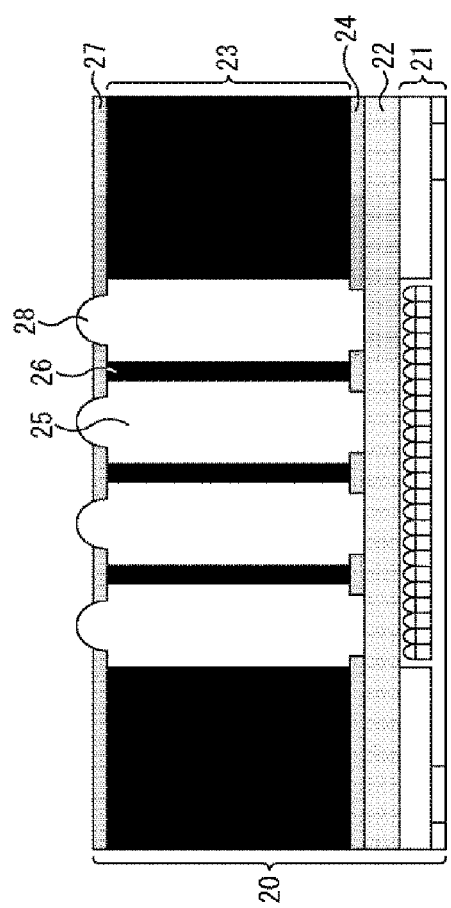
FIG. 11 is a cross-sectional view illustrating a first modification of the image sensor to which the present disclosure is applied.

Next, FIG. 11 illustrates the first modification of the image sensor 20 that can suppress the harmful influence.

In the first modification, the thickness of the thin-film joint resin layer 22 for joining the light receiving element layer 21 and the light shielding body 23 for shielding the α rays is increased. In this case, the thickness of the thin-film joint resin layer 22 may be preferably approximately 50 μm.

In the first modification, α rays emitted from the glass forming the light transmitting portion 25 of the light shielding body 23 are shielded by the thin-film joint resin layer 22. Therefore, it is possible to suppress the harmful influence by the α rays to the light receiving element of the light receiving element layer 21.

However, in the case of increasing the thickness of the thin-film joint resin layer 22, problems as will be described below may also be caused.

Figure 12:
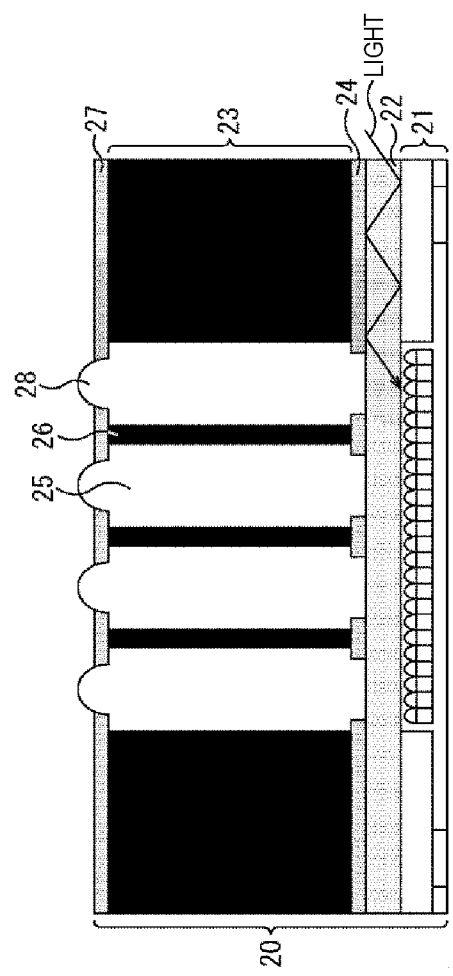
FIG. 12 is a diagram for explaining a problem of the first modification of the image sensor.

FIG. 12 illustrates a problem that may be caused in the first modification of the image sensor 20. In the case of increasing the thickness of the thin-film joint resin layer 22, as illustrated in FIG. 12, light enters the thin-film joint resin layer 22 from the side, the light is multiple-reflected in the thin-film joint resin layer 22 and is incident on the light receiving element of the light receiving element layer 21, thereby causing deterioration of image quality, such as ghost or flare.

Second Modification of Image Sensor 20 of Embodiment of the Present Disclosure

Figure 13:
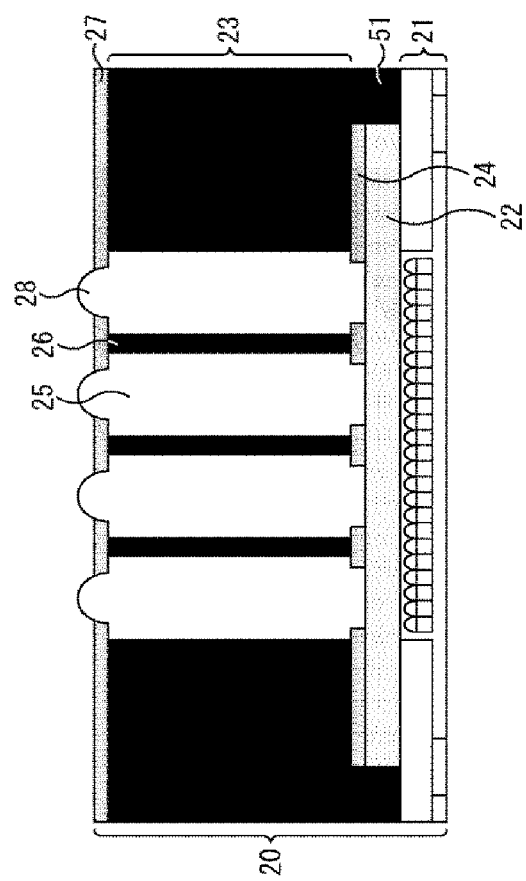
FIG. 13 is a cross-sectional view illustrating a second modification of the image sensor to which the present disclosure is applied.

Next, FIG. 13 illustrates a second modification of the image sensor 20 that can prevent light from entering the thin-film joint resin layer 22 with increased thickness from the side.

In the second modification, the light shielding wall 26 of the light shielding body 23 at an end of the image sensor 20 is extended to the side of the thin-film joint resin layer 22, thereby forming a projected portion 51.

In a step of forming the projected portion 51 to the light shielding body 23, an area as the projected portion 51 of the light shielding member may remain before opening a through-hole as the light transmitting portion 25 in the light shielding member, an area except for this may be recessed with the same level as the thickness of the thin-film joint resin layer 22 and the through-hole may be opened.

In the second modification, the side of a joint resin layer 22 is shielded with the projected portion 51. Therefore, it is possible to prevent the light from entering from the side of the thin-film joint resin layer 22 and being incident on the light receiving element and to suppress the deterioration of image quality.

Further, with the projected portion 51, an external exposed area of the thin-film joint resin layer 22 is reduced. Therefore, it is possible to suppress also entry of water and improve the reliability (for example, humidity resistance).

Further, the rigidity of the image sensor 20 is more improved with the projected portion 51 as compared with a state without the projected portion 51, thereby enabling suppression of warpage of the image sensor 20.

In the case of individually cutting (dicing) a plurality of the image sensors 20 formed on a wafer, with cutting at a position where the projected portion 51 exists, it is possible to prevent the deterioration of quality of the dicing due to processing of a different-type material.

Third Modification of Image Sensor 20 of Embodiment of the Present Disclosure

Figure 14:
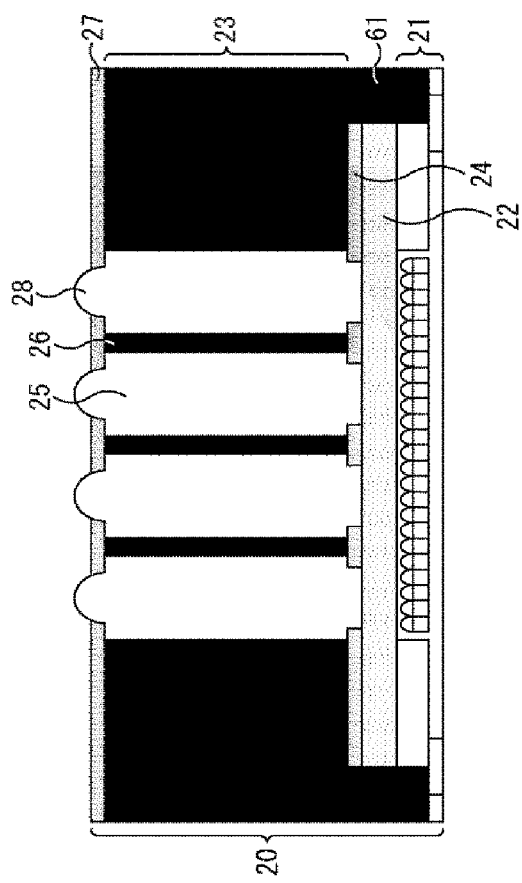
FIG. 14 is a cross-sectional view illustrating a third modification of the image sensor to which the present disclosure is applied.

Next, FIG. 14 illustrates a third modification of the image sensor 20 that can prevent light from entering from the side of the thin-film joint resin layer 22 with increased thickness.

In the third modification, the light shielding wall 26 of the light shielding body 23 at an end of the image sensor 20 is extended to the side of the light receiving element layer 21, thereby forming a projected portion 61.

Formation of the projected portion 61 is similar to that of the second modification. However, in the case of the third modification, an area for joint with the projected portion 61 needs to be formed with recessed shape also in the light receiving element layer 21.

In the third modification, the side of the joint resin layer 22 is shielded with the projected portion 61. Therefore, it is possible to prevent the light from entering from the side of the thin-film joint resin layer 22 and being incident on the light receiving element and to suppress the deterioration of image quality.

Further, with the projected portion 61, an external exposed area of the thin-film joint resin layer 22 is reduced. Therefore, it is possible to suppress the entry of water and to improve the reliability (for example, humidity resistance).

Further, the rigidity of the image sensor 20 is more improved with the projected portion 61 as compared with the state without the projected portion 61, thereby enabling suppression of warpage of the image sensor 20.

In the case of individually cutting (dicing) a plurality of the image sensors 20 formed on a wafer, with cutting at a position where the projected portion 61 exists, it is possible to prevent the deterioration of quality of the dicing due to processing of a different-type material.

Use Examples of Image Sensor

Figure 15:
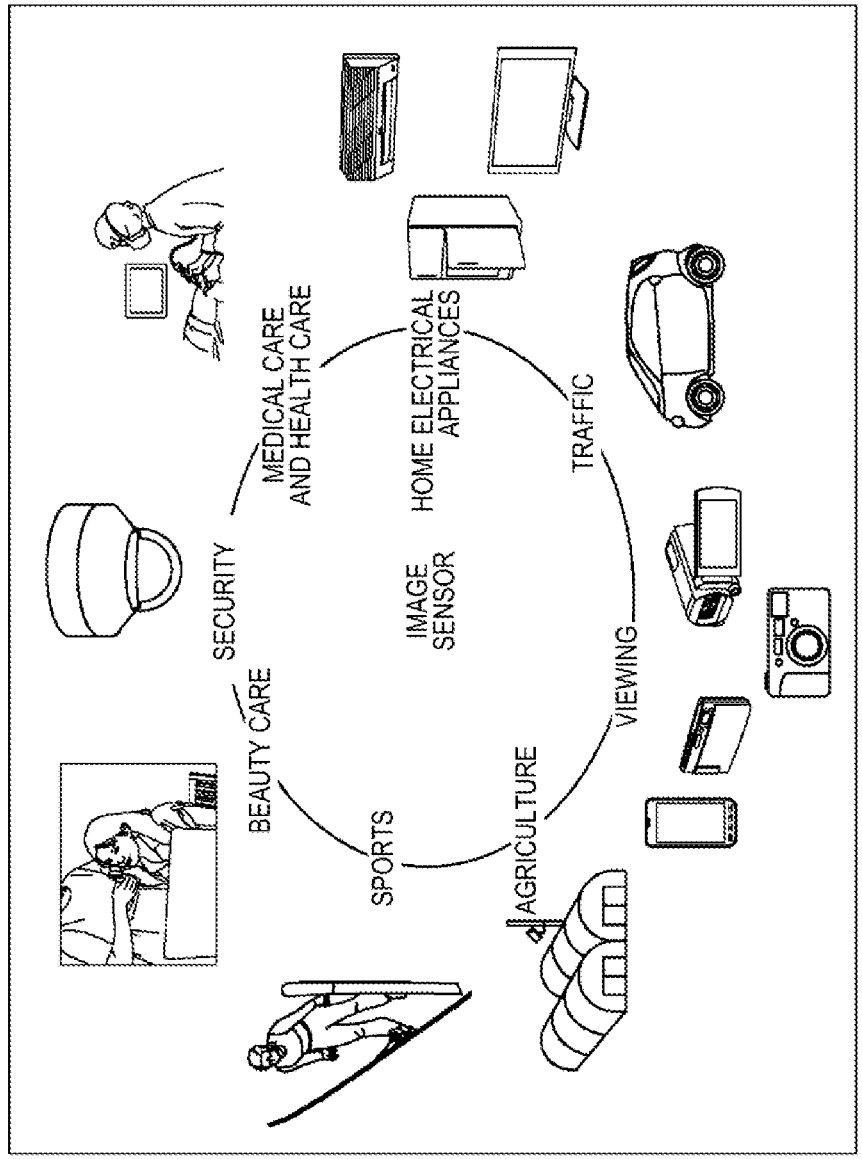
FIG. 15 is a diagram illustrating a use example of an electronic device to which the present disclosure is applied.

FIG. 15 is a diagram illustrating use examples in which the above-described image sensor is used.

The image sensor 20 can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

An embodiment of the disclosure is not limited to the embodiments described above, and various changes and modifications may be made without departing from the scope of the disclosure.

The present technology may also be configured as below.

(1) An image sensor including:
a light shielding body having light shielding walls and light transmitting portions each formed in an opening between the light shielding walls;
a first light-shielding layer formed on a light incident surface side of the light shielding body and having an opening narrower than the opening of the light shielding body for each of the openings of the light shielding body;
a microlens provided for each of the openings of the first light-shielding layer on the light incident surface side of the light shielding body; and
a light receiving element layer with an array of a large number of light receiving elements each performing photoelectrical conversion in accordance with incident light that is collected by the microlens and is input via the light transmitting portion of the light shielding body.

(2) The image sensor according to (1), further including:
a second light-shielding layer that is formed on a side of the light receiving element layer of the light shielding body and has an opening narrower than the opening of the light shielding body for each of the openings of the light shielding body.

(3) The image sensor according to (1) or (2),
in which the light shielding wall of the light shielding body is formed by Si.

(4) The image sensor according to any of (1) to (3),
in which the first light-shielding layer is formed by a light shielding member different from that of the light shielding wall.

(5) The image sensor according to any of (1) to (4),
in which the opening of the first light-shielding layer is circular.

(6) The image sensor according to any of (1) to (5),
in which a wall surface shape of the opening of the first light-shielding layer is reverse-tapered or vertical.

(7) The image sensor according to any of (2) to (6),
in which the second light-shielding layer is formed by a light shielding member different from that of the light shielding wall.

(8) The image sensor according to any of (2) to (7),
in which an opening of the second light-shielding layer is rectangular.

(9) The image sensor according to any of (2) to (8),
in which a light transmitting portion of the light shielding body is formed by filling a light shielding member into an opening between the light shielding walls.

(10) The image sensor according to any of (1) to (9), further including:
a joint layer that joins the light shielding body and the light receiving element layer; and
a light shielding portion that shields a side of the joint layer.

(11) The image sensor according to (10),
in which the light shielding portion is formed by extension of the light shielding wall of the light shielding body.

(12) The image sensor according to (10) or (11),
in which the light shielding portion is formed by extension of the light shielding wall of the light shielding body to the joint layer.

(13) The image sensor according to (10) or (11),
in which the light shielding portion is formed by extension of the light shielding wall of the light shielding body to the light receiving element layer.

(14) An electronic device having an image sensor mounted thereon,
the image sensor including
a light shielding body having light shielding walls and light transmitting portions each formed in an opening between the light shielding walls,
a first light-shielding layer formed on a light incident surface side of the light shielding body and having an opening narrower than the opening of the light shielding body for each of the openings of the light shielding body,
a microlens provided for each of the openings of the first light-shielding layer on the light incident surface side of the light shielding body, and
a light receiving element layer with an array of a large number of light receiving elements each performing photoelectrical conversion in accordance with incident light that is collected by the microlens and is input via the light transmitting portion of the light shielding body.

(15) An image sensor including:
a light shielding body having light shielding walls each using Si as a light shielding member and light transmitting portions each formed by filling a transparent member into an opening between the light shielding walls; and
a light receiving element layer with an array of a large number of light receiving elements each performing photoelectrical conversion in accordance with incident light input via the light shielding body.

REFERENCE SIGNS LIST 20 image sensor
21 light receiving element layer
22 thin-film joint resin layer
23 light shielding body
24 bottom-side light shielding layer
25 light transmitting portion
26 light shielding wall
27 top-side light shielding layer
28 microlens
51 projected portion
61 projected portion

The invention claimed is:
1. An image sensor, comprising:
a light shielding body that comprises a light incident surface, wherein:
the light shielding body includes a plurality of light shielding walls and a plurality of light transmitting portions, and
the plurality of light transmitting portions are in a first plurality of openings between the plurality of light shielding walls;
a first light-shielding layer that includes a second plurality of openings, wherein:
the first light-shielding layer is in contact with the light incident surface of the light shielding body, the first light-shielding layer has a first opening of the second plurality of openings narrower than an opening of the light shielding body for each of the first plurality of openings of the light shielding body, and
a wall surface shape of the first opening of the first light-shielding layer is reverse-tapered;
a microlens for each of the second plurality of openings of the first light-shielding layer on the light incident surface of the light shielding body; and
a light receiving element layer with an array of a plurality of light receiving elements, wherein:
each of the plurality of light receiving elements is configured to photoelectrically convert incident light, and
the incident light is collected by the microlens and is input via the plurality of light transmitting portions of the light shielding body.

2. The image sensor according to claim 1, further comprising a second light-shielding layer on a side of the light receiving element layer, wherein the second light-shielding layer has a second opening narrower than the opening of the light shielding body for each of the first plurality of openings of the light shielding body.

3. The image sensor according to claim 2, wherein each of the plurality of light shielding walls of the light shielding body comprises Silicon (Si).

4. The image sensor according to claim 2, wherein the first light-shielding layer includes a light shielding member different from a light shielding member of the plurality of light shielding walls.

5. The image sensor according to claim 2, wherein the first opening of the first light-shielding layer is circular.

6. The image sensor according to claim 2, wherein the second light-shielding layer includes a light shielding member different from a light shielding member of the plurality of light shielding walls.

7. The image sensor according to claim 2, wherein the second opening of the second light-shielding layer is rectangular.

8. The image sensor according to claim 2, wherein each of the plurality of light transmitting portions of the light shielding body includes a corresponding light shielding member into each of the first plurality of openings between the plurality of light shielding walls.

9. The image sensor according to claim 2, further comprising:
a joint layer that joins the light shielding body and the light receiving element layer; and
a light shielding portion that shields a side of the joint layer.

10. The image sensor according to claim 9, wherein the light shielding portion is extension of the plurality of light shielding walls of the light shielding body.

11. The image sensor according to claim 9, wherein the light shielding portion is extension of the plurality of light shielding walls of the light shielding body to the joint layer.

12. The image sensor according to claim 9, wherein the light shielding portion is extension of the plurality of light shielding walls of the light shielding body to the light receiving element layer.

13. An electronic device, comprising:
an image sensor, wherein the image sensor includes:
a light shielding body that comprises a light incident surface, wherein:
the light shielding body includes a plurality of light shielding walls and a plurality of light transmitting portions, and
the plurality of light transmitting portions are in a first plurality of openings between the plurality of light shielding walls;
a first light-shielding layer includes a second plurality of openings, wherein:
the first light-shielding layer is in contact with the light incident surface of the light shielding body,
the first light-shielding layer has a first opening of the second plurality of openings narrower than an opening of the light shielding body for each of the first plurality of openings of the light shielding body, and
a wall surface shape of the first opening of the first light-shielding layer is reverse-tapered;
a microlens for each of the second plurality of openings of the first light-shielding layer on the light incident surface of the light shielding body; and
a light receiving element layer with an array of a plurality of light receiving elements, wherein:
each of the plurality of light receiving elements is configured to photoelectrically convert incident light, and
the incident light is collected by the microlens and is input via the plurality of light transmitting portions of the light shielding body.

14. An image sensor, comprising:
a light shielding body that includes a light incident surface, wherein:
the light shielding surface body includes a plurality of light shielding walls and a plurality of light transmitting portions, and
the plurality of light transmitting portions are in a first plurality of openings between the plurality of light shielding walls,
each of the plurality of light shielding walls comprises is of Silicon (Si) as a light shielding member, and
the plurality of light transmitting portions includes a transparent member;
a first light-shielding layer that includes a second plurality of openings,
wherein a wall surface shape of a first opening of the first light-shielding layer is reverse-tapered; and
a light receiving element layer with an array of a plurality of light receiving elements, wherein:
each of the plurality of light receiving elements is configured to photoelectrically convert incident light, and
the incident light is input via the light shielding body.

* * * * *